United States Patent
Oikawa

(10) Patent No.: US 10,482,025 B2
(45) Date of Patent: Nov. 19, 2019

(54) MEMORY SYSTEM MANAGING ACCESS TO NONVOLATILE MEMORY

(71) Applicant: Toshiba Memory Corporation, Minato-ku (JP)

(72) Inventor: Kohei Oikawa, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 153 days.

(21) Appl. No.: 15/698,214

(22) Filed: Sep. 7, 2017

(65) Prior Publication Data

US 2018/0276135 A1  Sep. 27, 2018

(30) Foreign Application Priority Data

Mar. 22, 2017  (JP) ................................. 2017-056501

(51) Int. Cl.
| | | |
|---|---|---|
| G06F 13/00 | (2006.01) | |
| G06F 12/0891 | (2016.01) | |
| G06F 12/0895 | (2016.01) | |
| G06F 12/121 | (2016.01) | |
| G06F 12/02 | (2006.01) | |
| G11C 13/00 | (2006.01) | |
| G06F 12/0866 | (2016.01) | |
| G11C 16/34 | (2006.01) | |
| G06F 11/34 | (2006.01) | |

(52) U.S. Cl.
CPC ...... *G06F 12/0891* (2013.01); *G06F 12/0246* (2013.01); *G06F 12/0895* (2013.01); *G06F 12/121* (2013.01); *G06F 11/34* (2013.01); *G06F 12/0866* (2013.01); *G06F 2212/1036* (2013.01); *G06F 2212/312* (2013.01); *G06F 2212/466* (2013.01); *G06F 2212/7211* (2013.01); *G11C 13/0035* (2013.01); *G11C 16/349* (2013.01)

(58) Field of Classification Search
CPC .............. G06F 12/0246; G06F 3/0679; G06F 2212/7211
See application file for complete search history.

(56) References Cited

U.S. PATENT DOCUMENTS

| | | | |
|---|---|---|---|
| 9,292,451 B2 | 3/2016 | Dong | |
| 2008/0285346 A1* | 11/2008 | Han | G11C 8/10 365/185.05 |
| 2009/0113121 A1* | 4/2009 | Lee | G06F 12/0246 711/103 |
| 2009/0313453 A1* | 12/2009 | Stefanus | G06F 11/1441 711/210 |
| 2011/0213921 A1* | 9/2011 | Yu | G06F 3/061 711/103 |
| 2014/0337562 A1* | 11/2014 | Long | G06F 3/0659 711/103 |
| 2015/0106556 A1* | 4/2015 | Yu | G11C 16/349 711/103 |

(Continued)

*Primary Examiner* — Sean D Rossiter
(74) *Attorney, Agent, or Firm* — Oblon, McClelland, Maier & Neustadt, L.L.P.

(57) ABSTRACT

According to one embodiment, for each area having a first size, a number of accesses to the area is recorded in first information. In units of sub areas each having a second size smaller than the first size, access information for the sub area is recorded in the second information. In the first information, the number of accesses to an area to which a sub area in which duplicate accesses occur belongs is updated.

19 Claims, 7 Drawing Sheets

(56) References Cited

U.S. PATENT DOCUMENTS

2015/0106557 A1* 4/2015 Yu ..................... G11C 16/3431
  711/103
2015/0363129 A1 12/2015 Watanabe et al.
2016/0005464 A1 1/2016 Hu et al.
2016/0357474 A1* 12/2016 Frid ..................... G06F 3/0634
2018/0190329 A1* 7/2018 Kathawala ............... G11C 7/04

* cited by examiner

FIG.2

| NUMBER OF ACCESSES TO AREA #1 |
|---|
| NUMBER OF ACCESSES TO AREA #2 |
| NUMBER OF ACCESSES TO AREA #3 |
| ⋮ |
| NUMBER OF ACCESSES TO AREA #N |

FIG.3

| VALIDNESS | ADDRESS |
|---|---|
| 1 | ADDRESS a |
| 1 | ADDRESS b |
| 1 | ADDRESS c |
| ⋮ | ⋮ |
| 1 | ADDRESS x |
| 0 | ADDRESS y |
| ⋮ | ⋮ |

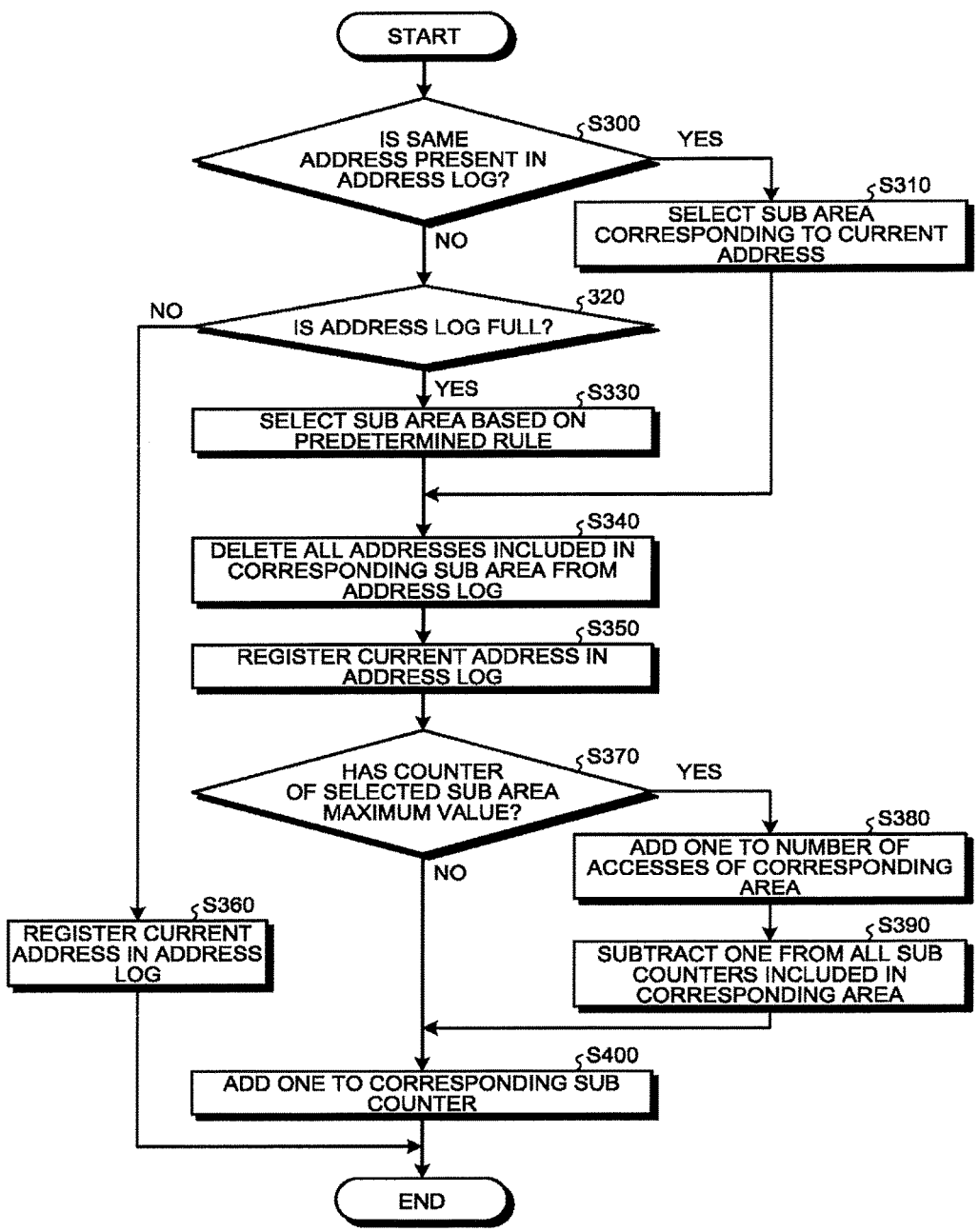

MEMORY SYSTEM MANAGING ACCESS TO NONVOLATILE MEMORY

CROSS-REFERENCE TO RELATED APPLICATIONS

This application is based upon and claims the benefit of priority from Japanese Patent Application No. 2017-056501, filed on Mar. 22, 2017; the entire contents of which are incorporated herein by reference.

FIELD

Embodiments described herein relate generally to a memory system including a nonvolatile memory and a method of controlling a nonvolatile memory.

BACKGROUND

In a memory system including a nonvolatile memory, in order to measure the degree of wear of the nonvolatile memory, it is requested to manage the number of accesses to the nonvolatile memory.

BRIEF DESCRIPTION OF THE DRAWINGS

FIG. 2 is a conceptual diagram that illustrates an example of an address log;

FIG. 3 is a conceptual diagram that illustrates an example of an access number table;

FIG. 9 is a flowchart that illustrates an operation according to the third embodiment.

DETAILED DESCRIPTION

In general, according to one embodiment, a memory system includes a nonvolatile memory and a memory controller. The memory controller controls the nonvolatile memory. The memory controller records, for each area, a number of accesses to the area in first information, each of the areas being included in the nonvolatile memory and having a first size. The memory controller records, in units of sub areas, access information to the sub area in second information, each of the sub areas being included in one of the areas and having a second size smaller than the first size. The memory controller updates the number of accesses to an area to which a sub area in which duplicate accesses occur belongs among the sub areas recorded in the second information among the numbers of accesses recorded in the first information for each of the areas.

Exemplary embodiments of a memory system will be explained below in detail with reference to the accompanying drawings. The present invention is not limited to the following embodiments.

First Embodiment

Figure 1:
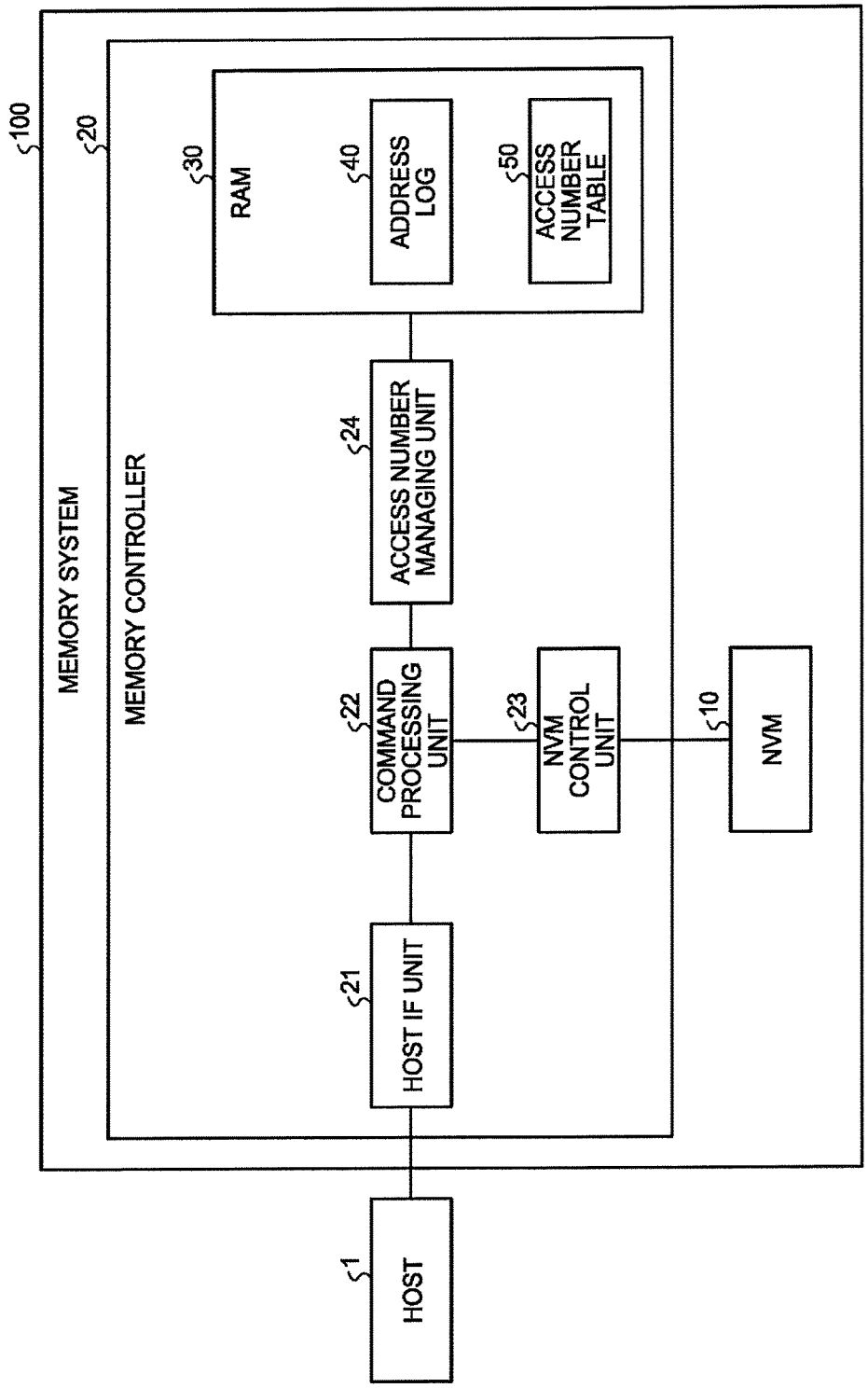
FIG. 1 is a block diagram that illustrates an example of the configuration of a memory system according to a first embodiment.

FIG. 1 is a block diagram that illustrates an example of the configuration of a memory system 100 according to a first embodiment. The memory system 100 is connected to a host apparatus (hereinafter, abbreviated to a host) 1 through a communication line and functions as an external memory device of the host 1. The host 1, for example, may be an information processing apparatus such as a personal computer, a cellular phone, an imaging apparatus, a portable terminal such as a tablet computer or a smartphone, a gaming device, or an in-vehicle terminal such as a car navigation system. The host 1 transmits a write request and a read request to the memory system 100.

The memory system 100 includes a nonvolatile semiconductor memory (hereinafter, abbreviated to an NVM) 10 and a memory controller 20. The NVM 10 is, for example, a storage class memory (SCM). Examples of the SCM include a cross-point type memory, a phase change memory (PCM), a magnetoresistive random access memory (MRAM), a resistance random access memory (ReRAM), and a ferroelectric random access memory (FeRAM). As the NVM 10, a NAND flash memory having a two-dimensional configuration or a three-dimensional configuration may be used.

The NVM 10 includes one or a plurality of memory chips each including a memory cell array in which a plurality of memory cells are arranged in an array pattern. In each memory cell, binary recording or a multi-value recording can be performed. For example, the position of a memory cell can be designated using a physical address including a chip address, a word line address, a bit line address, and the like.

The memory system 100 writes data into the NVM 10 in response to a write request from the host 1. The memory system 100 reads data from the NVM 10 in response to a read request from the host 1.

The memory controller 20 includes a host IF unit 21, a command processing unit 22, an NVM control unit 23, an access number managing unit 24, and a RAM 30. The RAM 30 may be arranged outside the memory controller 20. The RAM 30 stores an address log 40 and an access number table 50. The address log 40 and the access number table 50 are backed up into the NVM 10.

The host IF unit 21 receives a write request and a read request from the host 1. The write request includes a write command, a write address, and write data. The read request includes a read command and a read address. The host IF unit 21 transmits the write request or the read request that has been received to the command processing unit 22. In addition, the host IF unit 21 transmits user data read from the NVM 10, a response of the command processing unit 22, and the like to the host 1.

The command processing unit 22 performs control according to a command received from the host 1 through the host IF unit 21. For example, in a case where a write request is received from the host 1, the command processing unit 22 translates a write address as a logical address into a physical address and determines a real address on the NVM 10 at which write data is to be written. The logical address is an address designated by the host 1. As the logical address, for example, logical block addressing (LBA) is used. The real address represents a storage position on the NVM 10 at which data is stored. The command processing unit 22 outputs write data received from the host 1 and the determined real address to the NVM control unit 23 and the access number managing unit 24.

In addition, in a case where a read request is received from the host 1, the command processing unit 22 translates a read address as a logical address into a physical address and determines a real address on the NVM 10 from which data is to be read. The command processing unit 22 outputs the determined real address to the NVM control unit 23 and the access number managing unit 24.

The NVM control unit 23 accesses the NVM 10 based on an access type (a classification between read and write) and a real address input from the command processing unit 22 and performs read control or write control for the NVM 10. The NVM control unit 23 may include an error correcting code (ECC) circuit. The ECC circuit performs an error correcting coding process for data transmitted from the command processing unit 22 and generates parity. The ECC circuit outputs a code word including data and the parity to the NVM 10. The ECC circuit performs an error correcting decoding process by using a code word read from the NVM 10 and transmits decoded data to the command processing unit 22.

Here, the SCM used for the NVM 10 is a memory positioned between a main storage memory such as a dynamic random access memory (DRAM) and a storage (a NAND flash memory or the like). Depending on memory characteristics, the SCM is considered to have the speed, the cost, and the life that are between those of the DRAM and those of the NAND. In other words, in the SCM, the number of accesses is not substantially unlimited unlike the DRAM, and predetermined management is necessary in order to measure the degree of wear. In addition, in the SCM, the access granularity is expected to be small to be at a same level as that of the DRAM. For example, while a read unit or a write unit for a DRAM is about 32 B or 64 B, a read unit or a write unit for a NAND flash memory is about 4 KB.

In this way, while the number of accesses needs to be managed for the SCM, in a case where the access granularity is small, when the number of accesses is managed with the granularity, the management information becomes huge. To the contrary, in a case where the number of accesses is managed with large granularity, an error from the number of accesses managed with appropriate granularity increases. For example, in a case where each of 100 portions within a certain area is accessed once, the number of accesses to the certain area is 100. Then, actually, while the wear of each memory cell within the certain area corresponds to one access at most, the management operation may be performed assuming that a memory cell having a wear corresponding to 100 accesses may be present, and a more pessimistic estimation than the degree of wear of a memory for which the number of accesses is managed with appropriate access granularity is made.

Thus, in this embodiment, the storage area of the NVM 10 is divided into a plurality of areas, and a total number of accesses to each area is managed using the access number table 50. Meanwhile, by using the address log 40, current and latest accesses are managed in units of sub areas of granularity finer than that of the area. The address log 40 manages accesses to a different certain number of sub areas. In one certain area, in a case where accesses to different sub areas occur, a total number of accesses for the area is not updated. On the other hand, in one certain area, in a case where two accesses to a same sub area occur, in other words, in a case where duplicate accesses to a same sub area occur, the total number of accesses for the area is updated. In this way, in this embodiment, the measurement precision of the number of accesses that is an index of the degree of wear can be improved and the volume of the management table is suppressed.

In order to acquire the degree of wear of the NVM 10, the access number managing unit 24 manages the numbers of accesses to a plurality of areas of the NVM 10 by using the address log 40 and the access number table 50. In this embodiment, in order to acquire the degree of wear of the NVM 10, the access number managing unit 24 manages only accesses that are based on write requests from the host 1. In addition, the access number managing unit 24 may manage accesses that are based on write requests and read requests from the host 1, and the number of accesses may be managed to include accesses to the NVM 10 that are based on an internal process (garbage collection, refresh control, or the like) of the memory controller 20.

When a write request including a write command, a write address, and write data is received from the host 1, the command processing unit 22 normalizes this write request in units of a predetermined management size K. This management size K corresponds to the address management unit of the address log 40. In other words, the following operations are performed.
(a) In a case where the data size of a write request exceeds the management size K, the received write request is divided into a plurality of write requests of the management size K. In other words, the write address and the write data are divided into the management size K.
(b) In a case where the data size of a write request is less than the management size K, the write data is processed with being regarded as data of the management size K.

The command processing unit 22 translates a write address as a normalized logical address into a physical address of the NVM 10 and determines a real address on the NVM 10 at which the normalized write data is to be written. The command processing unit 22 notifies the access number managing unit 24 of the translated physical address in units of the management size K.

The access number managing unit 24 records information including the physical address notification of which is given from the command processing unit 22 in the address log 40 as access information. The access number managing unit 24 updates the access number table 50 in accordance with the state of the address log 40.

FIG. 2 is a diagram that illustrates an example of the access number table 50. The access number table 50 is a table used for managing the numbers of accesses (total numbers of accesses) to N areas #1 to #N acquired by dividing the storage area of the NVM 10 into N areas for each of the areas #1 to #N. Here, N is a natural number of two or more. The storage area of the NVM 10 to be divided into N areas, for example, may be a user data area included in the total storage area of the NVM. The user data area is an area into which write data received from the host 1 is written among the total storage area of the NVM 10.

FIG. 3 is a diagram that illustrates an example of the address log 40. The address log 40 includes a certain number L of entries for recording access information. The address log 40 manages the access information in units of sub areas acquired by further dividing each area managed by the access number table 50 into M sub areas. Here, M is a natural number of two or more. A physical address in units of the management size K notification of which is given from the command processing unit 22 corresponds to the size of the sub area. In each entry of the address log 40, an address used for specifying the position of one sub area and a valid bit representing validness/invalidness of the entry are recorded as the access information. An address recorded in each entry of the address log 40 may not be complete address information but, for example, may be information acquired by removing some bits of the address. However, in order to manage the number of accesses in the access number table 50, an address recorded in each entry of the address log 40 needs to be address information capable of determining one sub area and one area to which it belongs. In the address log 40, only one address specifying a same sub area, in other words, only one same address is recorded. Accordingly, the address log 40 manages access information of L different sub areas corresponding to the capacity of the address log 40.

Figure 4:
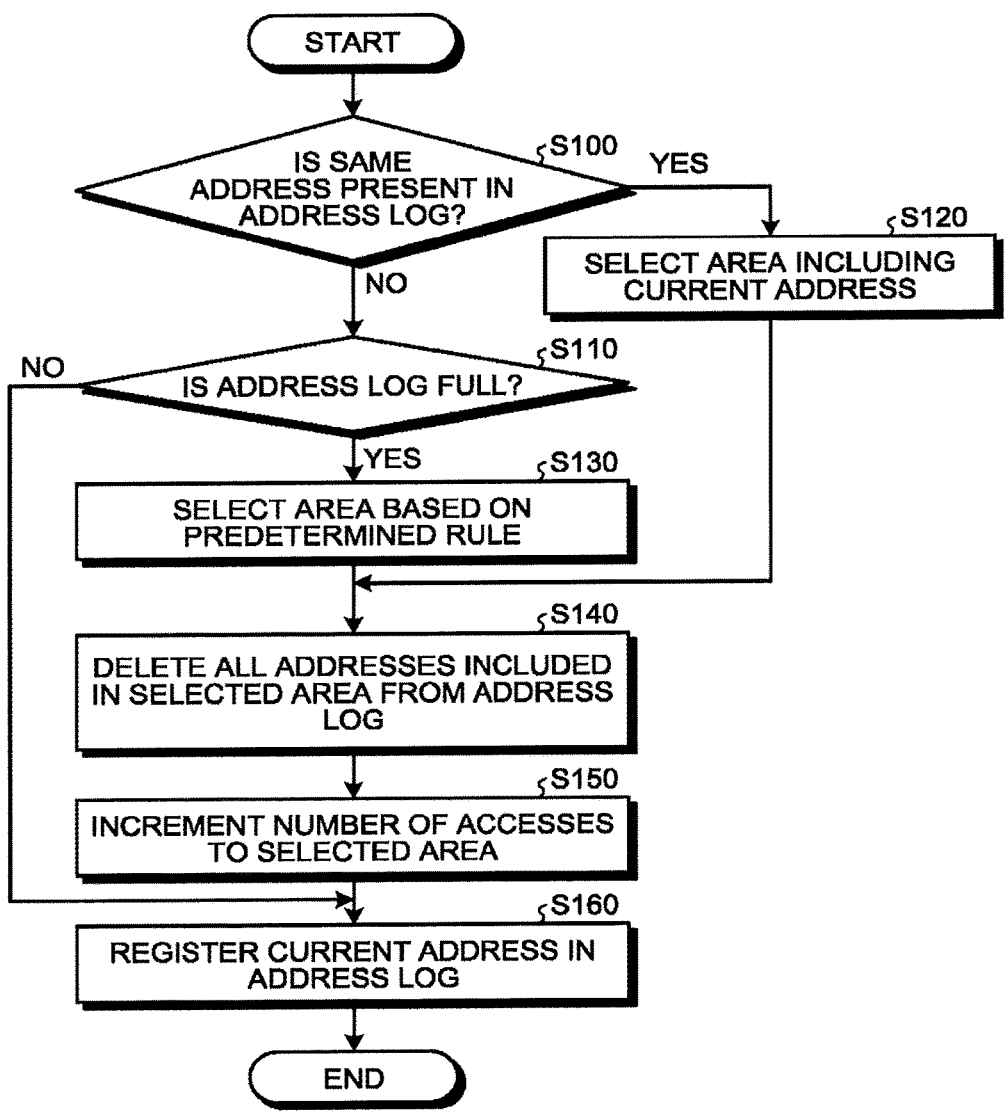
FIG. 4 is a flowchart that illustrates an operation according to a first embodiment.

FIG. 4 illustrates a control sequence executed by the access number managing unit 24 when a physical address of a current write request is notified from the command processing unit 22. Here, the current write request is a write request that is a current processing target of the access number managing unit 24. Hereinafter, the operation of the access number managing unit 24 according to the first embodiment will be described with reference to FIG. 4. The access number managing unit 24 determines whether or not the same address as the current physical address designated according to the current write request has already been registered in the address log 40 (S100). The access number managing unit 24 determines whether or not duplicate accesses to the same sub area occur in this process. In a case where the same address as the current physical address is not registered in the address log (S100: No), the access number managing unit 24 determines whether or not the address log 40 is full by determining the valid bit of each entry of the address log 40 (S110). The address log 40 being full corresponds to a state in which the valid bits of all the entries of the address log 40 is "1". In a case where the address log is not full (S110: No), the access number managing unit 24 registers the current physical address in an empty entry or an entry of which the valid bit is "0", of the address log 40 and sets the valid bit of the entry to "1" (S160).

In a case where the same address as the current physical address has already been registered in the address log 40 (S100: Yes), the access number managing unit 24 selects an area to which the current physical address belongs among a plurality of areas #1 to #N of the access number table 50 as an update target area (S120).

In a case where the address log 40 is full (S110: Yes), the access number managing unit 24 selects one area among one or a plurality of areas to which the address that has already been registered in the address log 40 belongs as an update target area in accordance with a predetermined selection rule (S130). For example, an area to which an address registered earliest in the address log 40 belongs may be selected as an update target area. Alternatively, among N areas registered in the access number table 50, an area of which the greatest number of addresses of belonging sub areas are registered in the address log 40 may be selected as an update target area. For example, in a case where four addresses of sub areas belonging to the area #1 are registered in the address log 40, and one address of a sub area belonging to the area #2 is registered in the address log 40, the area #1 is selected as an update target area.

Next, the access number managing unit 24 deletes, from the address log 40, all the entries in which addresses belonging to the area selected as the update target area are registered (S140). In the example illustrated in FIG. 3, the valid bits of all the entries of the address log 40 in which addresses belonging to the area selected as the update target area are registered are set to be in an invalid state. In addition, the access number managing unit 24 accesses the access number table 50 and increments the number of accesses to the area selected as the update target area (S150). Finally, the access number managing unit 24 registers the current physical address in an entry of which the valid bit is "0" or an empty entry, of the address log 40 and sets the valid bit of the entry to "1" (S160). However, in Step S130, in a case where an area to which the current physical address designated in the current write request belongs is selected as an update target area, in Step S160, the current physical address is not registered in the address log 40.

Figure 5:
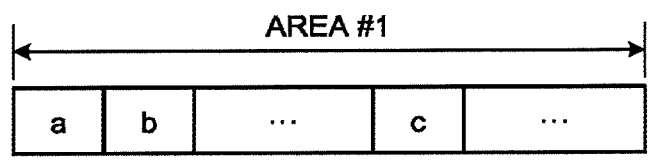
FIG. 5 is a conceptual diagram that illustrates the operation according to the first embodiment.

FIG. 5 is a diagram that conceptually illustrates an access to a certain area #1 of the NVM 10. It is assumed that address a, address b, and address c are registered in advance in the address log 40 as addresses belonging to the area #1. At the time of accessing the address a for the first time, at the time of accessing the address b for the first time, or at the time of accessing the address c for the first time, the number of accesses to the area #1 is not updated. In this state, when an access to the address c occurs, the same address has already been registered in the address log 40, and accordingly, the number of accesses to the area #1 in the access number table 50 is incremented. In addition, the address a, the address b, and the address c belonging to the area #1 are deleted from the address log 40. Thereafter, the address c is registered in the address log 40.

In this way, in the first embodiment, histories of accesses to sub areas of different addresses are accumulatively recorded in the address log 40. Then, when duplicate accesses to a sub area of the same address occur, the number of accesses to a corresponding area that is an area to which this sub area belongs is incremented. In addition, all the histories belonging to the corresponding area described above are deleted from the address log 40. Thus, according to the first embodiment, the measurement precision of the number of accesses that is an index of the degree of wear can be improved while the volume of the management table is suppressed. Particularly, in a case where there are many sequential accesses, the number of accesses in the access number table 50 is not updated until the address log 40 becomes full. For this reason, the number of sequential accesses can be accurately recorded.

In addition, in the case of a memory system in which a correspondence relation between a logical address designated by the host and the real address of the NVM 10 is fixed, the address log may manage logical addresses.

Second Embodiment

Figure 6:
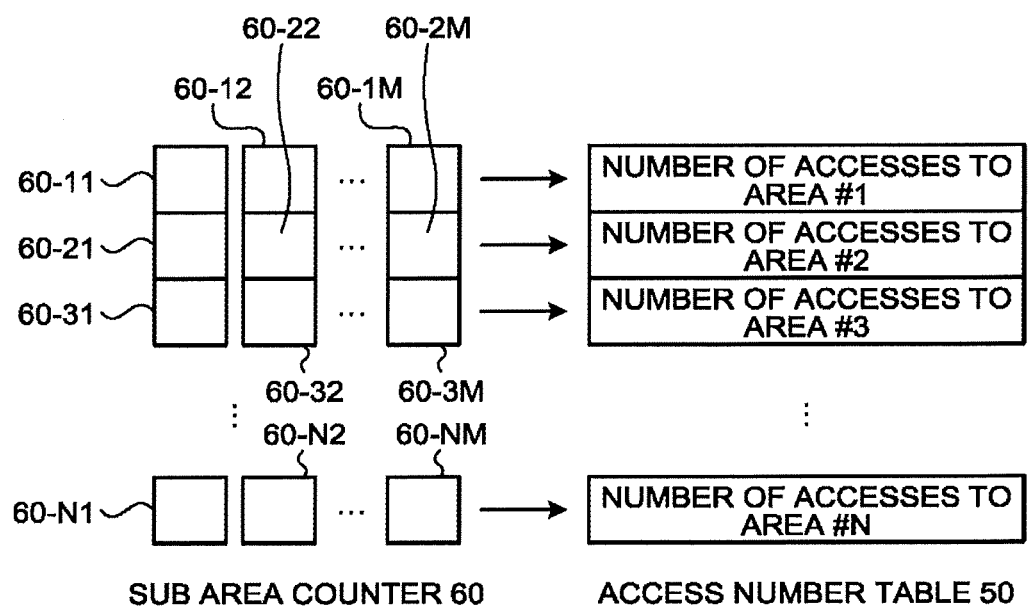
FIG. 6 is a block diagram that illustrates an example of the configuration of a part of a memory system according to a second embodiment.

FIG. 6 is a diagram that illustrates a second embodiment. According to the second embodiment, instead of the address log 40, a sub area counter 60 illustrated in FIG. 6 is included. The other constituent elements are similar to those of the first embodiment, and thus, duplicate description will not be presented.

In the second embodiment, a recording unit that is dedicatedly used for recording access information is disposed for each sub area. In this second embodiment, as a recording unit used for recording access information, the sub area counter 60 counting the number of accesses to each sub area is employed. The sub area counter 60 separately manages access information for each sub area acquired by further dividing the area that is a management unit of the access number table 50 into M sub areas.

The sub area counter 60 includes a plurality of counters for each of areas #1 to #N. Counters 60-11, 60-12, ..., 60-1M are counters used for managing accesses to the area #1. The counter 60-11 dedicatedly manages accesses to a first sub area of the area #1. The counter 60-12 dedicatedly manages accesses to a second sub area of the area #1. The counter 60-1M dedicatedly manages accesses to an M-th sub area of the area #1. Similarly, a counter 60-21 dedicatedly manages accesses to a first sub area of the area #2, a counter 60-22 dedicatedly manages accesses to a second sub area of the area #2, and a counter 60-2M dedicatedly manages accesses to an M-th sub area of the area #2. Hereinafter, this similarly applies. A bit width per one counter is about several bits (for example, two bits).

Also in the second embodiment, when a write request including a write command, a write address, and write data is received from a host 1, a command processing unit 22 normalizes this write request in a predetermined management size. The command processing unit 22 translates the normalized write address into a physical address of an NVM 10. The command processing unit 22 notifies an access number managing unit 24 of a physical address in units of a translated management size R. The size R specified according to the physical address notification of which is given from the command processing unit 22 is the same as or smaller than the size of the sub area.

Figure 7:
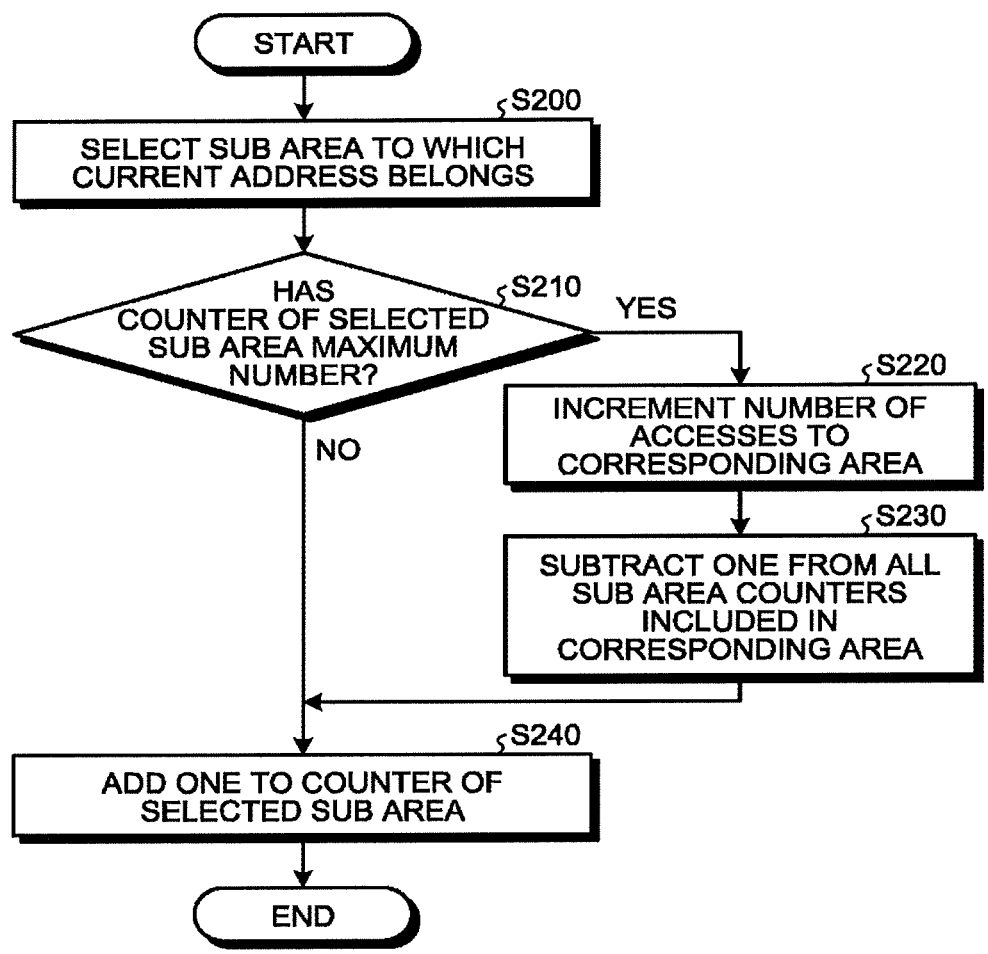
FIG. 7 is a flowchart that illustrates an operation according to the second embodiment.

FIG. 7 illustrates a control sequence executed by the access number managing unit 24 when a physical address of a current write request is notified from the command processing unit 22. Hereinafter, the operation of the access number managing unit 24 according to the second embodiment will be described with reference to FIG. 7. The access number managing unit 24 selects a sub area to which a current physical address designated according to a current write request belongs (S200). The access number managing unit 24 accesses the sub area counter 60 and determines whether or not a count value of the counter of the selected sub area reaches a first value (S210). The access number managing unit 24 determines whether or not duplicate accesses to the same sub area occur according to this process. In this embodiment, the first value is a maximum value of the counter. The first value is set to a value of two or more. By determining whether or not the count value of the counter of the sub area reaches the first value, it is determined whether or not the number of accesses to the same sub area reaches the first value. In a case where the count value of the counter of the selected sub area does not reach the maximum value (S210: No), the access number managing unit 24 increments the counter of the selected sub area (S240).

In a case where the count value of the counter of the selected sub area reaches the maximum value (S210: Yes), the access number managing unit 24 accesses the access number table 50 and increments the number of accesses to an area to which the selected sub area belongs (S220). In addition, the access number managing unit 24 subtracts one from each of the counters of all the sub areas belonging to the area of which the number of accesses has been incremented (S230). However, in a case where one is to be subtracted from a counter of which the count value is zero, the count value after the subtraction remains to be zero. Finally, in order to reflect the access information of this time, the counter of the selected sub area is incremented (S240).

In this way, in the second embodiment, a counter is disposed for each sub area, and the access information is separately managed for each sub area by using a plurality of the counters. When accesses to the same sub area occur, the number of accesses to a corresponding area that is an area to which this sub area belongs is incremented. In addition, one is subtracted from each of the count values of all the sub areas belonging to the corresponding area. Thus, according to the second embodiment, the measurement precision of the number of accesses that is an index of the degree of wear can be improved while the volume of the management table is suppressed. Particularly, also in a case where there are many random accesses over the whole area, all the sub areas can be covered by the sub area counters 60, and accordingly, the number of random accesses can be accurately recorded.

In the description presented above, while the configuration of the counters each having a width of several bits is employed as a recording unit used for recording access information for each sub area, a recording unit for recording access information only representing the presence or absence of an access to each sub area may be employed. In such a case, when duplicate accesses to the same sub area occur, the number of accesses to a corresponding area that is an area to which this sub area belongs is incremented. In addition, the access information of all the sub areas belonging to the area of which the number of accesses has been incremented is updated to the absence of an access. Finally, the access information of the sub area having duplicate accesses is updated to the presence of an access.

Third Embodiment

Figure 8:
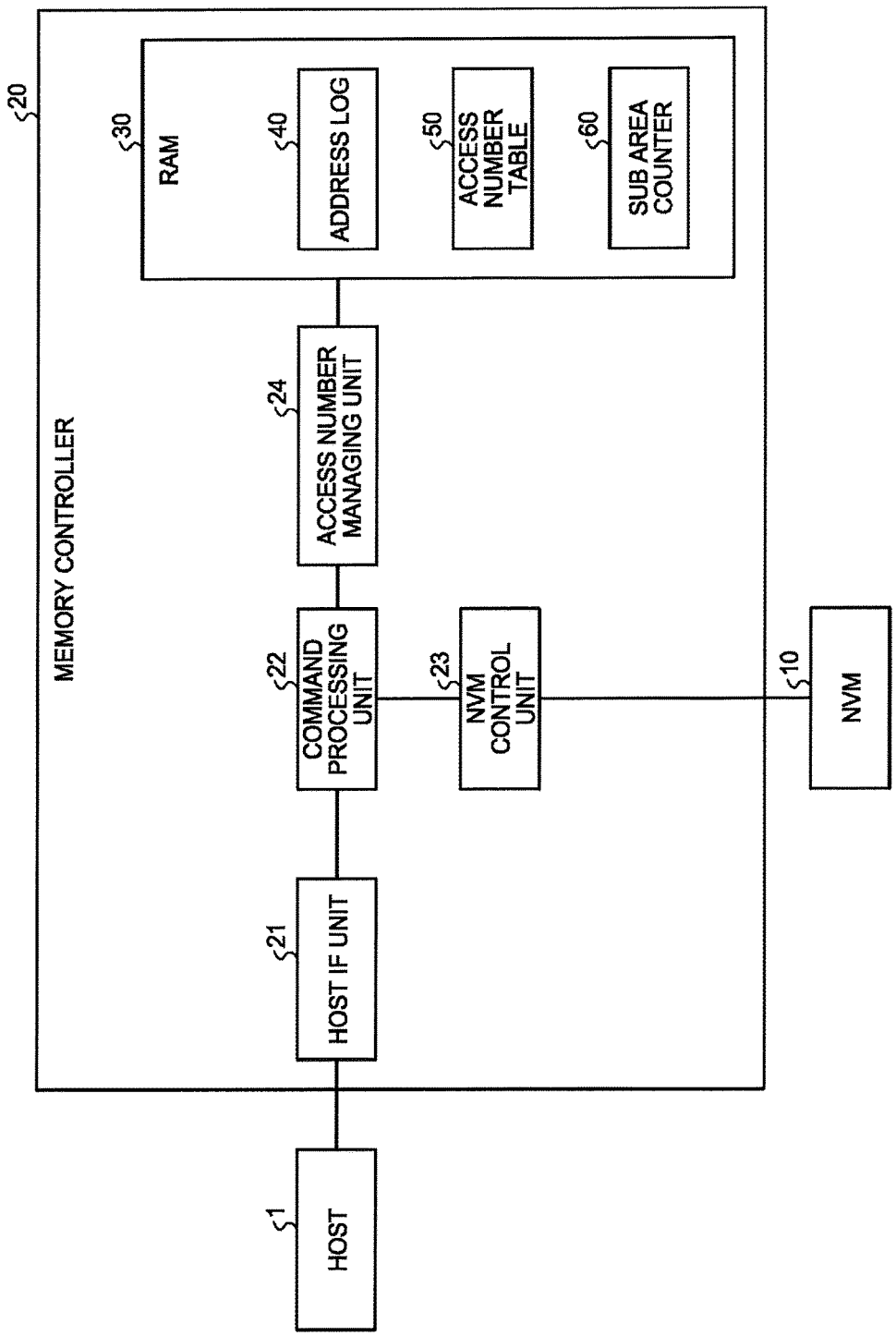
FIG. 8 is a block diagram that illustrates an example of the configuration of a memory system according to a third embodiment.

FIG. 8 is a block diagram that illustrates an example of the configuration of a memory system 100 according to third embodiment. In the third embodiment, the first embodiment and the second embodiment are combined. The memory system according to the third embodiment includes an address log 40, an access number table 50, and a sub area counter 60. The basic configurations of the address log 40, the access number table 50, and the sub area counter 60 are similar to those according to the first or second embodiment. The other constituent elements are similar to those of the first or second embodiment, and thus, duplicate description will not be presented. However, in the third embodiment, when the size of a small area specified by a physical address notification of which is given from a command processing unit 22, in other words, an address managed by the address log 40 is R, the size of a sub area is S, and the size of areas #1 to #N managed by the access number table 50 is T, a relation of "size R of small area"<"size S of sub area"<"size T of area" is set to be formed. In other words, the address log 40 manages access information in units of small areas, the sub area counter 60 manages access information in units of sub areas, and the access number table 50 manages access information in units of areas.

FIG. 9 illustrates a control sequence executed by an access number managing unit 24 when notification of a physical address of a current write request is given from the command processing unit 22. Hereinafter, the operation of the access number managing unit 24 according to the third embodiment will be described with reference to FIG. 9. The access number managing unit 24 determines whether or not the same address as the current physical address corresponding to a small area designated according to the current write request has already been registered in the address log 40 (S300). The access number managing unit 24 determines whether or not duplicate accesses to the same small area occur in this process. In a case where the same address as the current physical address is not registered in the address log (S300: No), the access number managing unit 24 determines whether or not the address log 40 is full by determining the valid bit of each entry of the address log 40 (S320). In a case where the address log is not full (S320: No), the access number managing unit 24 registers the current physical address in an empty entry or an entry of which the valid bit is "0", of the address log 40 and sets the valid bit of the entry to "1" (S360).

In a case where the same address as the current access address has already been registered in the address log 40 (S300: Yes), the access number managing unit 24 selects a sub area to which the physical address of the current small area belongs as an update target sub area (S310).

In a case where the address log 40 is full (S320: Yes), the access number managing unit 24 selects one sub area among one or a plurality of sub areas to which the address of the small area that has already been registered in the address log 40 belongs as an update target area in accordance with a certain selection rule (S330). For example, a sub area to which an address registered earliest in the address log 40 belongs may be selected as an update target sub area. Alternatively, among a plurality of areas registered in the access number table 50, an area of which the greatest number of addresses of belonging sub areas are registered in the address log 40 may be selected as an update target area.

Next, the access number managing unit 24 deletes all the entries in which addresses belonging to the sub area selected in Step S310 or S320 as the update target sub area are registered from the address log 40 (S340). In addition, the access number managing unit 24 registers the physical address of the current small area in an empty entry or an entry of which the valid bit is "0", of the address log 40 and sets the valid bit of the entry to "1" (S350). However, in Step S330, in a case where an area to which the current physical address designated in the current write request belongs is selected as an update target area, in Step S350, the current physical address is not registered in the address log 40.

Next, the access number managing unit 24 accesses the sub area counter 60 and determines whether or not a count value of the counter of the sub area selected in Step S310 or Step S330 reaches a first value (S370). The access number managing unit 24 determines whether or not duplicate accesses to the same sub area occur according to this process. The first value is, for example, a maximum value of the counter. The first value is set to a value of two or more. In a case where the count value of the counter of the selected sub area is not the maximum value (S370: No), the counter of the selected sub area is incremented (S400).

In a case where the count value of the counter of the selected sub area reaches the maximum value (S370: Yes), the access number managing unit 24 accesses the access number table 50 and increments the number of accesses to an area to which the selected sub area belongs (S380). In addition, the access number managing unit 24 subtracts one from each of the counters of all the sub areas belonging to the area of which the number of accesses has been incremented (S390). However, in a case where one is to be subtracted from a counter of which the count value is zero, the count value after the subtraction remains to be zero. Finally, in order to reflect the access information of this time, the access number managing unit 24 increments the counter of the selected sub area (S400).

In this way, according to the third embodiment, the address log 40 manages access information in units of small areas, the sub area counter 60 manages access information in units of sub areas, and the access number table 50 manages access information in units of areas. Then, in a case where duplicate accesses to the same small area occur, the address log 40 and the sub area counter 60 are managed such that the number of accesses to a sub area to which a small area in which the duplicate accesses occur belong is updated. In addition, in a case where duplicate accesses to the same sub area occur, the sub area counter 60 and the access number table 50 are managed such that the number of accesses to an area to which the sub area in which the duplicate accesses have occurred belong is updated. Accordingly, according to the third embodiment, the measurement precision of the number of accesses that is an index of the degree of wear can be improved while the volume of the management table is suppressed.

In the third embodiment, in a case where the sub area to which an access having locality such as a sequential access can be made is divided with a size allowing stability, the occurrence probability of the process of Steps S370 to S400 decreases, and the number of sequential accesses and random accesses can be accurately recorded. However, to the contrary, there are cases where accesses are inclined to a specific area depending on the access pattern of the host 1, and accordingly, the access pattern of the host 1 may be determined, and the division size of the sub area may be changed based on the determination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a plurality of areas having a first size and respective sub areas of a second size;
   a first recording unit;
   a second recording unit; and
   a memory controller configured to
      record, for each area, a number of accesses to the area in the first recording unit,
      record, in units of sub areas, access information to the sub area in the second recording unit, each of the sub areas being included in one of the areas and having a second size smaller than the first size, and
      for each of the areas for which accesses are recorded in the first recording unit and to which belongs a sub area in which occurs a duplicate access recorded in the second recording unit, update the number of accesses to each said area in the first recording unit in relation to the duplicate access to the respective sub area recorded in the second recording.

2. The memory system according to claim 1,
   wherein the access information is an address of a sub area to be accessed, and
   wherein the memory controller is configured to
      record a certain number of pieces of the access information in the second recording unit,
      in a case where first access information corresponding to a first access received from a host is recorded in the second recording unit, update a number of accesses to a first area that is an area in which a sub area corresponding to the first access is included among the numbers of accesses recorded in the first recording unit for each of the areas, delete access information of all the sub areas included in the first area from the second recording unit, and record the first access information in the second recording unit, and in a case where the first access information is not recorded in the second recording unit, record the first access information in the second recording unit.

3. The memory system according to claim 2, wherein, in a case where the first access information is not recorded in the second recording unit and in a case where the certain number of pieces of the access information is recorded in the second recording unit, the memory controller selects one area from among a plurality of the areas based on a first selection rule, updates the number of accesses to a second area that is the selected area, deletes the access information of all the sub areas belonging to the second area from the second recording unit, and records the first access information in the second recording unit.

4. The memory system according to claim 3, wherein the first selection rule includes selecting of an area to which a sub area of which the access information is recorded earliest in the second recording unit belongs as the second area.

5. The memory system according to claim 3, wherein the first selection rule includes selecting of an area including the greatest number of sub areas of which the access information is recorded in the second recording unit as the second area.

6. The memory system according to claim 1,
wherein the access information includes information representing presence or absence of an access, and
wherein the memory controller is configured to
record the access information of each of the sub areas in the second recording unit,
in a case where the access information of a sub area corresponding to a first access received from a host represents presence of the access in the second recording unit, update a number of accesses to a first area that is an area in which the sub area corresponding to the first access is included among the numbers of accesses recorded in the first recording unit for each of the areas, delete the access information of all the sub areas included in the first area from the second recording unit, and update the access information of the sub area corresponding to the first access in the second recording unit with presence of the access, and
in a case where the first access information is not recorded in the second recording unit, update the access information of the sub area corresponding to the first access in the second recording unit with presence of the access.

7. The memory system according to claim 1,
wherein the access information includes a number of accesses, and
wherein the memory controller is configured to
record the access information of each of the sub areas in the second recording unit,
in a case where the number of accesses to a sub area corresponding to a first access received from a host does not reach a first value in the second recording unit, count up the number of accesses included in the access information of the sub area corresponding to the first access in the second recording unit, and
in a case where the number of accesses to the sub area corresponding to the first access reaches the first value in the second recording unit, update the number of accesses to a first area that is an area in which the sub area corresponding to the first access is included among the numbers of accesses recorded in the first recording unit for each of the areas, count down the number of accesses included in the access information of all the sub areas included in the first area in the second recording unit, and count up the number of accesses included in the access information of the sub area corresponding to the first access in the second recording unit.

8. The memory system according to claim 1, wherein an access unit of the nonvolatile memory is smaller than an access unit of a NAND flash memory.

9. A memory system comprising:
a nonvolatile memory including a plurality of areas having a first size, each area including respective sub areas of a second size smaller than said first size, and each sub area having small areas of a third size smaller than said second size;
a first recording unit
a second recording unit
a third recording unit and
a memory controller configured to
control the nonvolatile memory,
record, for each area, a number of accesses to the area in first recording unit,
record, for each sub area, access information to the sub area in the second recording unit,
record, in units of small areas, access information to the small areas in third recording unit,
for each of the sub areas for which accesses are recorded in the second recording unit and to which belongs a small area in which occurs a duplicate access recorded in the third recording unit, update the number of accesses to each said sub area in the second recording unit in relation to the duplicate access to the respective small area recorded in the third recording unit, and
for each of the areas for which accesses are recorded in the first recording unit and to which belongs the sub area in which occurs the duplicate access recorded in the second recording unit, update the number of accesses to each said area in the first recording unit in relation to the duplicate access to the respective sub area recorded in the second recording.

10. The memory system according to claim 9,
wherein the access information recorded in the third recording unit is an address of the small area to be accessed,
wherein the access information recorded in the second recording unit includes information representing the number of accesses, and
wherein the memory controller is configured to
record a certain number of pieces of the access information in the third recording unit,
record the access information of each sub area in the second recording unit,
in a case where first access information corresponding to a first access received from a host is recorded in the third recording unit, select a first sub area that is a sub area in which the small area corresponding to the first access is included, delete the access information of all the small areas included in the selected first sub area from the third recording unit, and record the first access information in the third recording unit,
in a case where the first access information is not recorded in the third recording unit, record the first access information in the third recording unit, in a case where the number of accesses to the sub area corresponding to the first sub area does not reach a first value in the second recording unit, count up the number of accesses included in the access information of the sub area corresponding to the first access in the second recording unit, and in a case where the number of accesses to the sub area corresponding to the first access reaches the first value in the second recording unit, update the number of accesses to a first area that is an area in which the sub area corresponding to the first access is included among the numbers of accesses recorded in the first recording unit for each of the areas, count down the number of accesses included in the access information of all the sub areas included in the first area in the second recording unit, and count up the number of accesses included in the access information of the sub area corresponding to the first access in the second recording unit.

11. The memory system according to claim 9, wherein an access unit of the nonvolatile memory is smaller than an access unit of a NAND flash memory.

12. A method of controlling a memory system, the memory system including a nonvolatile memory including a plurality of areas having a first size and respective sub areas of a second size, a first recording unit, and a second recording unit, the method comprising:

recording, for each area, a number of accesses to the area in first recording unit, recording, in units of sub areas, access information to the sub area in second recording unit, for each of the areas for which accesses are recorded in the first recording unit and to which belongs a sub area in which occurs a duplicate access recorded in the second recording unit, updating the number of accesses to each said area in the first recording unit in relation to the duplicate access to the respective sub area recorded in the second recording.

13. The method according to claim 12, wherein the access information is an address of a sub area to be accessed, the method further comprising recording a certain number of pieces of the access information in the second recording unit, in a case where first access information corresponding to a first access received from a host is recorded in the second recording unit, updating a number of accesses to a first area that is an area in which a sub area corresponding to the first access is included among the numbers of accesses recorded in the first recording unit for each of the areas, deleting access information of all the sub areas included in the first area from the second recording unit, and recording the first access information in the second recording unit, and in a case where the first access information is not recorded in the second recording unit, recording the first access information in the second recording unit.

14. The method according to claim 13, further comprising in a case where the first access information is not recorded in the second recording unit and in a case where the certain number of pieces of the access information is recorded in the second recording unit, selecting one area from among a plurality of the areas based on a first selection rule, updating the number of accesses to a second area that is the selected area, deleting the access information of all the sub areas belonging to the second area from the second recording unit, and recording the first access information in the second recording unit.

15. The method according to claim 14, wherein the first selection rule includes selecting of an area to which a sub area of which the access information is recorded earliest in the second recording unit belongs as the second area.

16. The method according to claim 14, wherein the first selection rule includes selecting of an area including the greatest number of sub areas of which the access information is recorded in the second recording unit as the second area.

17. The method according to claim 12,
wherein the access information includes information representing presence or absence of an access,
the method further comprising
recording the access information of each of the sub areas in the second recording unit,
in a case where the access information of a sub area corresponding to a first access received from a host represents presence of the access in the second recording unit, updating a number of accesses to a first area that is an area in which the sub area corresponding to the first access is included among the numbers of accesses recorded in the first recording unit for each of the areas, deleting the access information of all the sub areas included in the first area from the second recording unit, and updating the access information of the sub area corresponding to the first access in the second recording unit with presence of the access, and
in a case where the first access information is not recorded in the second recording unit, updating the access information of the sub area corresponding to the first access in the second recording unit with presence of the access.

18. The method according to claim 12, wherein the access information includes a number of accesses, the method further comprising
recording the access information of each of the sub areas in the second recording unit,
in a case where the number of accesses to a sub area corresponding to a first access received from a host does not reach a first value in the second recording unit, counting up the number of accesses included in the access information of the sub area corresponding to the first access in the second recording unit, and
in a case where the number of accesses to the sub area corresponding to the first access reaches the first value in the second recording unit, updating the number of accesses to a first area that is an area in which the sub area corresponding to the first access is included among the numbers of accesses recorded in the first recording unit for each of the areas, counting down the number of accesses included in the access information of all the sub areas included in the first area in the second recording unit, and counting up the number of accesses included in the access information of the sub area corresponding to the first access in the second recording unit.

19. The method according to claim 12, wherein an access unit of the nonvolatile memory is smaller than an access unit of a NAND flash memory.

* * * * *